United States Patent
Nagata et al.

(10) Patent No.: US 7,337,087 B2
(45) Date of Patent: Feb. 26, 2008

(54) CIRCUIT ANALYZING APPARATUS, CIRCUIT ANALYZING METHOD AND CIRCUIT ANALYZING PROGRAM

(75) Inventors: Megumi Nagata, Kawasaki (JP); Masaki Tosaka, Kawasaki (JP); Makoto Suwada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/543,068

(22) Filed: Oct. 5, 2006

(65) Prior Publication Data

US 2007/0294048 A1 Dec. 20, 2007

(30) Foreign Application Priority Data

Jun. 16, 2006 (JP) ............................. 2006-168165

(51) Int. Cl.
*G06F 17/50* (2006.01)

(52) U.S. Cl. ................. 702/117; 702/118; 702/119; 716/1; 716/2; 716/4; 716/6; 716/8; 716/13; 235/15; 235/462

(58) Field of Classification Search ............... 702/117; 716/1, 2, 4, 6, 8, 13
See application file for complete search history.

(56) References Cited

U.S. PATENT DOCUMENTS

| 6,725,430 | B2 * | 4/2004 | Draxler et al. ................. 716/1 |
| 7,035,783 | B2 | 4/2006 | Nagata et al. |
| 2005/0160391 | A1 * | 7/2005 | Orita ........................... 716/13 |

FOREIGN PATENT DOCUMENTS

| JP | 2001-165974 | 6/2001 |
| JP | 2003-132112 | 5/2003 |
| JP | 2005-534083 | 11/2005 |

* cited by examiner

*Primary Examiner*—John Barlow
*Assistant Examiner*—Sujoy Kundu
(74) *Attorney, Agent, or Firm*—Kratz, Quintos & Hanson, LLP

(57) ABSTRACT

A circuit analyzing apparatus for analyzing operation characteristics of a circuit unit in which, on a substrate, circuit devices are arranged, has a part for automatically obtaining a value of a substrate parameter concerning the substrate for an operating frequency, which value depends on the operating frequency; and a part for analyzing operation of the circuit unit based on the value of the substrate parameter for the operating frequency.

15 Claims, 10 Drawing Sheets

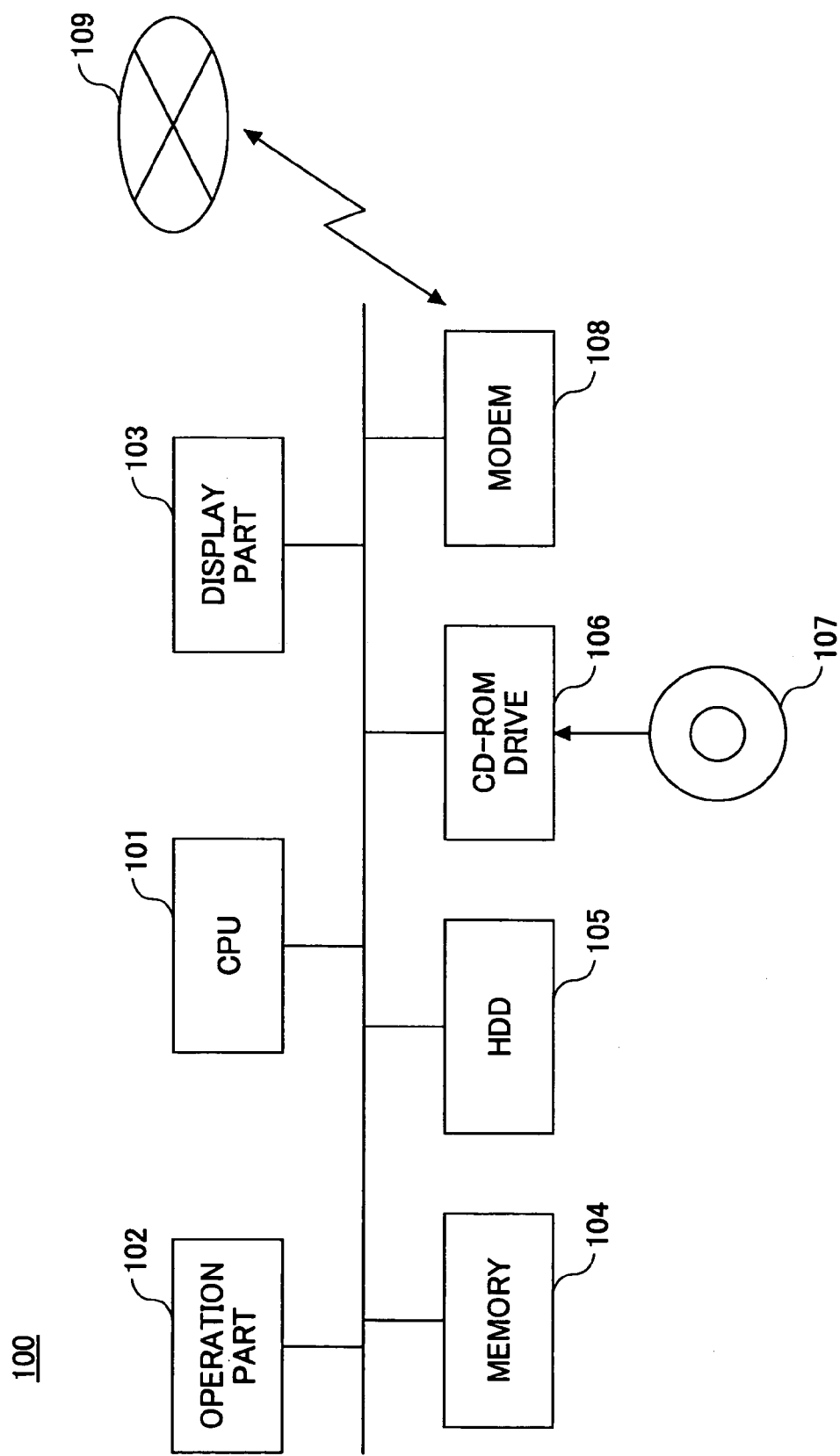

CIRCUIT ANALYZING APPARATUS, CIRCUIT ANALYZING METHOD AND CIRCUIT ANALYZING PROGRAM

BACKGROUND OF THE INVENTION

1. Field of the Invention

The present invention relates to a circuit analyzing apparatus, a circuit analyzing method and a circuit analyzing program, and, in particular, to a circuit analyzing apparatus, a circuit analyzing method and a circuit analyzing program for analyzing operating characteristics of a circuit unit having circuit devices arranged on a substrate.

2. Description of the Related Art

Recently, in a circuit unit having circuit devices arranged on a substrate, an influence of parameters (referred to as 'substrate parameters', hereinafter) such as a dielectric constant, a dielectric dissipation factor and so forth, having values depending on characteristics of material of the substrate, cannot be ignored in many cases when operating characteristics of the circuit unit are analyzed.

That is, in the analysis for the operating characteristics, respective parameter values on operating frequency/operating temperature, which are conditions for the analysis, are required. In this case, because the substrate parameters such as the above-mentioned dielectric constant ($\in r$) and the dielectric dissipation factor ($\tan \delta$) depend on the operating frequency/temperature, the values according to the corresponding conditions are required. However, in a catalog for the substrate material, the values merely for typical frequency/temperature are given, in many cases.

For example, as shown in FIG. 1, when the analyzing frequency is 2 GHz for example, a designer may use the values given by the catalog as they are even when the catalog values are merely for a different operating frequency of 1 GHz. In such a case, the substrate parameters thus obtained may considerably deviate from the correct values due to the difference in the operating frequency. Therefore, a signal waveform obtained from the analysis may have considerable error accordingly.

Further, in a case where, as shown in FIG. 2, the substrate manufacturer provides two typical values in the catalog, an approximation formula (i.e., a linear function for linear approximation, in many cases) may be used for obtaining the necessary characteristic values from those corresponding to these two values. That is, with the use of the approximation formula, the values on the target analyzing frequency are obtained. However, the calculation by means of the approximation formula of the linear function may inevitably include calculation error in many cases.

Further, in many cases, no information is given from the catalog concerning temperature characteristics of the substrate parameters, and the designer should use the values on the typical temperature given by the catalog in many cases.

No serious issue may arise even when the frequency/temperature characteristics of the substrate parameters are not strictly considered for a case of transmission simulation for a low frequency condition. However, as the operating frequency increases, improvement of the analysis precision is required accordingly, and thus, the necessity of considering the frequency/temperature dependency of the substrate parameters arises.

Japanese Laid-open Patent Applications Nos. 2001-165974, 2005-534083 and 2003-132112 disclose related arts.

SUMMARY OF THE INVENTION

The present invention has been devised in consideration of the above-described situation, and, an object of the present invention is to provide a circuit analyzing apparatus, a circuit analyzing method and a circuit analyzing program by which analyzing of circuit operation with high precision can be achieved in consideration of frequency or temperature characteristics of the substrate parameters.

According to the present invention, values of substrate parameters for a target operating frequency or a target operating temperature are automatically obtained. It is noted that, the substrate parameters are those of a substrate with which a circuit unit, to analyze its operating characteristics, is produced, and depend on the operating frequency and/or the operation temperature of the circuit unit.

As a result of operation analysis of the circuit unit being carried out based on the thus-obtained substrate parameters, it is possible to easily achieve operation analysis of the circuit unit for the target operation frequency and/or the target operating temperature with high precision.

Thus, by means of the present invention, it is possible to easily achieve operation analysis of a circuit unit for a target operating frequency and/or a target operating temperature with high precision, and thus, it is possible to positively provide the circuit unit with high performance.

BRIEF DESCRIPTION OF THE DRAWINGS

Other objects and further features of the present invention will become more apparent from the following detailed description when read in conjunction with the accompanying drawings:

FIGS. 5 through 9 illustrate the contents of actual processing carried out by the circuit analyzing apparatus in the embodiment of the present invention; and FIG. 10 illustrates a case where the circuit analyzing apparatus according to the embodiment of the present invention is realized by a computer.

DETAILED DESCRIPTION OF THE PREFERRED EMBODIMENTS

With reference to figures, a circuit analyzing method, a circuit analyzing apparatus and a circuit analyzing program, according to embodiments of the present invention, will now be described.

The circuit analyzing method according to the embodiment of the present invention includes a substrate parameter automatic setting method in a transmission simulation process.

The transmission simulation means, in a work of developing a circuit unit, a simulation of operation, actually carried out by means of circuit operation analysis for a case where the circuit unit of the development is actually operated as a data transmission unit.

More specifically, the circuit analyzing method according to the embodiment of the present invention includes a method for automatically setting appropriate frequency dependent substrate parameters corresponding to an actual transmission frequency, in the transmission simulation process.

Further, according to the circuit analyzing method in the embodiment of the present invention, a function as a simulation tool, employing a frequency characteristic table for obtaining the appropriate substrate parameters, can be achieved.

Further, the circuit analyzing method according to the embodiment of the present invention includes a method for automatically setting appropriate temperature dependent substrate parameters corresponding to an actual ambient temperature, in the transmission simulation process.

Further, according to the circuit analyzing method in the embodiment of the present invention, a function as a simulation tool, having a temperature characteristic table for obtaining the appropriate substrate parameters, can be achieved.

Further, according to the circuit analyzing method in the embodiment of the present invention, a function as a simulation tool, by which the appropriate substrate parameters for both the actual frequency and the actual temperature can be automatically set, can be achieved.

According to the circuit analyzing method in the embodiment of the present invention, as a result of thus providing the configuration for automatically setting the frequency and/or the temperature dependent substrate parameters, the user should merely designate the target analyzing frequency and temperature, and as a result, from the table provided in the tool, the substrate parameters on the corresponding frequency and temperature are automatically set, and operation analysis of the circuit unit can be carried out according to the thus-obtained setting with high precision.

Figure 1:
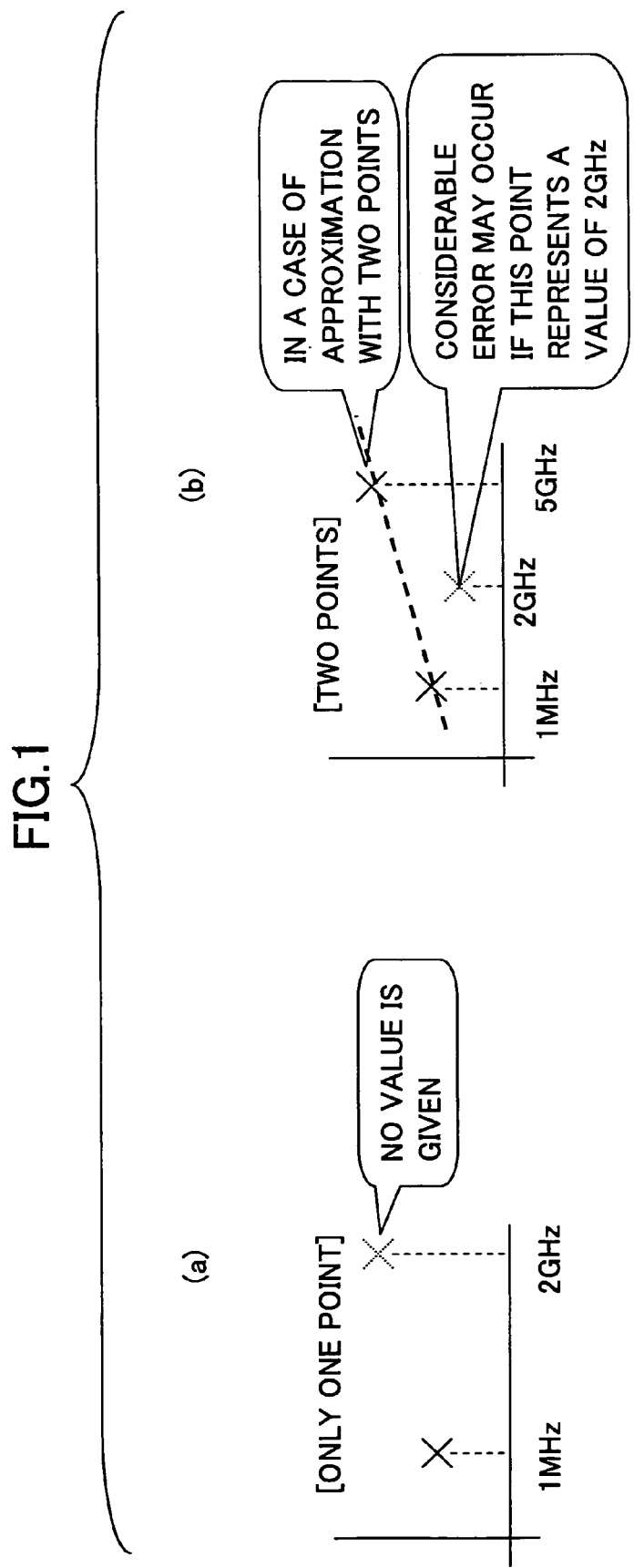
FIG. 1 illustrates a problem occurring in the prior art.
Figure 2:
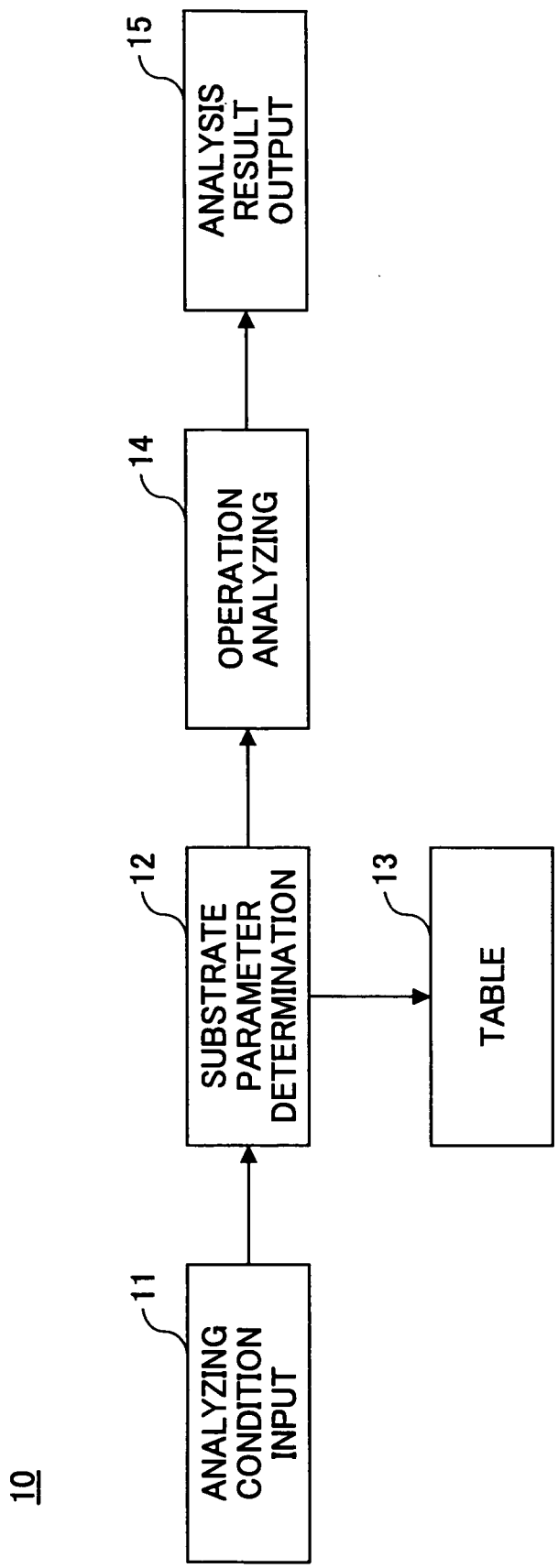
FIG. 2 shows a block diagram illustrating a general configuration of a circuit analyzing apparatus according to one embodiment of the present invention.

FIG. 2 shows a block diagram illustrating a general configuration of a circuit analyzing apparatus for carrying out the circuit analyzing method in the embodiment of the present invention.

The circuit analyzing apparatus includes an analyzing condition inputting part 11, a substrate parameter determining part 12, an operation analyzing part and an analysis result outputting part 15.

A user, i.e., a circuit designer or developer, first inputs analyzing conditions required for the transmission simulation process including the circuit operation analysis process, from the analyzing condition inputting part 11. According to the input contents, the substrate parameter determining part 12 determines substrate parameters required for the transmission simulation process including the circuit operation analysis process, with reference to a table 13 previously provided. Based on the thus-obtained substrate parameters, the operation analyzing part 14 carries out the transmission simulation process including the circuit operation analysis process. Analysis results thus obtained, i.e., the transmission simulation results, are output from the analysis result outputting part 15.

An actual target of the transmission simulation process including the circuit operation analysis process is, as mentioned above, a circuit unit in which, on a predetermined substrate, circuit devices such as LSI devices, are disposed.

Operation of such a circuit unit is influenced by the substrate parameters having values depending on the material of the substrate. Therefore, the substrate parameters determining part 12 obtains the substrate parameters according to the analyzing conditions (including the information concerning the substrate material) input from the analyzing condition inputting part 11, the operation analyzing part 14 analyses operation of the circuit unit based on the thus-obtained substrate parameters, and thus, the transmission simulation process is carried out.

The substrate parameter determining part 12 obtains the substrate parameters with reference to the table 13 previously provided. As a result, it is possible to obtain the parameters values with high precision corresponding to the analyzing frequency and/or temperature. As a result, it is possible to carry out operation analysis with high precision corresponding to the analyzing frequency and/or temperature, and thus, it is possible to obtain transmission simulation results with high precision.

A detailed configuration of the circuit analyzing method in the embodiment of the present invention, in a flow of the entirety of a circuit unit developing work, will now be described.

Figure 3:
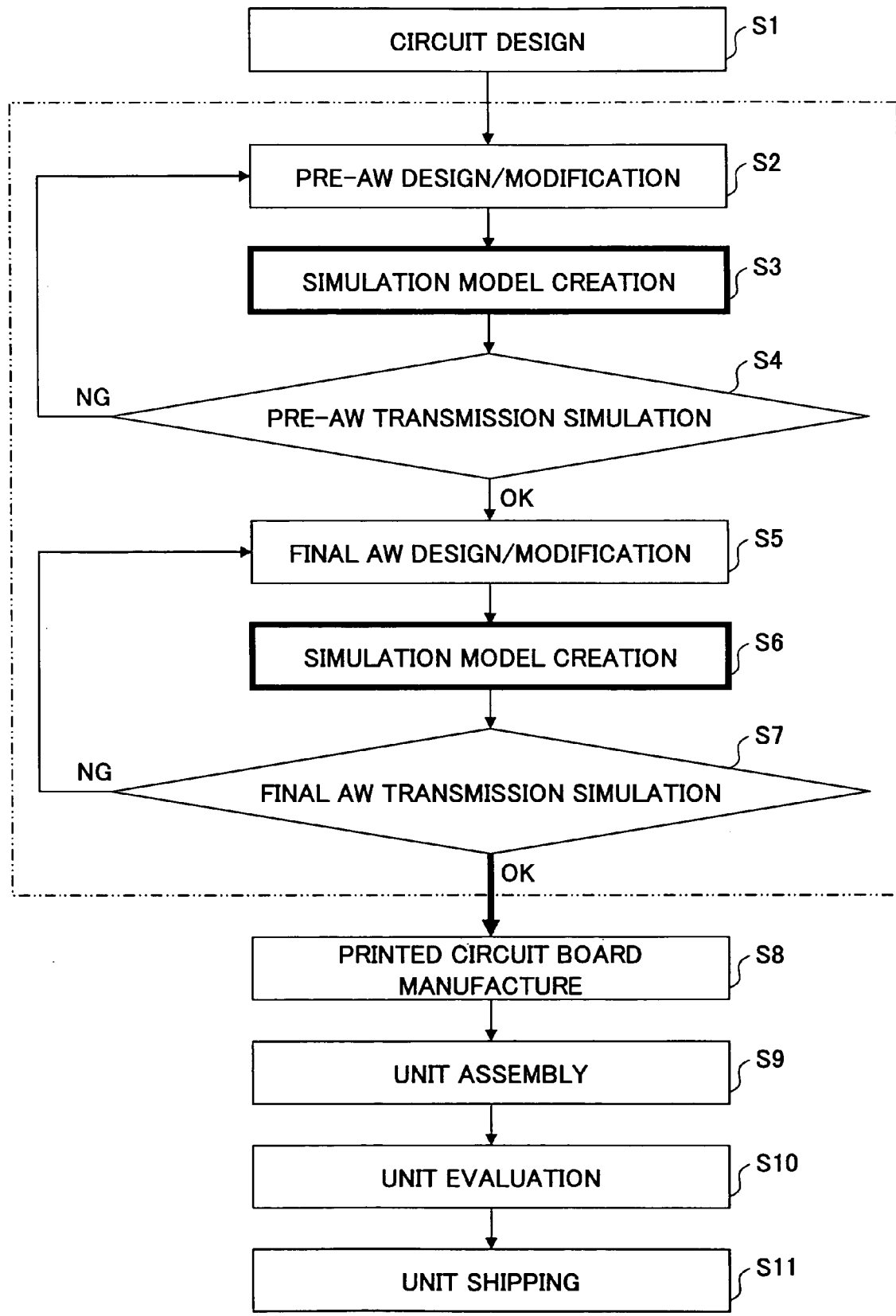
FIGS. 3 and 4 show a flow chart illustrating a flow of processing carried out by the circuit analyzing apparatus in the embodiment of the present invention.

FIG. 3 shows a work flow chart showing a flow of the entirety of the circuit unit developing work.

In FIG. 3, when basic circuit design is finished in Step S1, pre-artwork (AW) design/modification work is carried out in Step S2. Specifically, the given design for an artwork, is modified appropriately based on a result of a transmission simulation process of Step S4.

Next, in Step S3, as a preparation work for the transmission simulation process (Step S4), a simulation model is created. That is, operation analyzing conditions required for the transmission simulation process are prepared. The operation analyzing conditions include characteristics of the LSI devices themselves included in the circuit unit, input signals for simulating actual operating conditions of the circuit unit for a case where it is actually operated as a data transmission unit, and so forth, as well as the above-mentioned substrate parameters.

In Step S4, the transmission simulation process is actually carried out according to the simulation model created in Step S3. Specifically, a circuit analyzing simulation tool (i.e., made of software or such) called a "field solver", is employed, and a computer automatically carries out the simulation according to the field solver.

When the work of the pre-AW design in Steps S2 through S4 is finished, a final artwork (final AW) design (i.e., so-called packaging design) is carried out.

It is noted that, the pre-AW design is carried out in prior to the final AW design corresponding to the packaging design, and, operation of the given circuit unit is verified in a simulation manner with the use of a circuit model which is relatively simplified from the final AW design. In a case where the analysis results, i.e., operation waveforms and so forth, meeting predetermined requirements, have been obtained from the transmission simulation process of Step S4, the loop of Step S2 through S4 is finished, and the next loop of Steps S5 through S7, i.e., the final AW design work, is started.

Also in this case, the same as in the pre-AW design work, modification of the design (Step S5) made based on transmission simulation process (Step S7), creation of a simulation model based on the thus-obtained design contents (Step S6), and the transmission simulation process according to the thus-obtained simulation model (Step S7), are carried out. Then, in a case where the analysis results meeting predetermined requirements are obtained, the loop is finished, and then, a work starting from Step S8 is started.

In Steps S8 and S9, the circuit unit is actually manufactured according to the thus-finally-fixed final AW design contents in Steps S1 through S7, then evaluation thereof is carried out in Step S10, and then, the product is shipped.

The part enclosed by a chain double-dashed line, i.e., the operation in Step S2 through S7 of FIG. 3, corresponds to the operation carried out by means of the circuit analyzing apparatus shown in FIG. 2.

Figure 4:
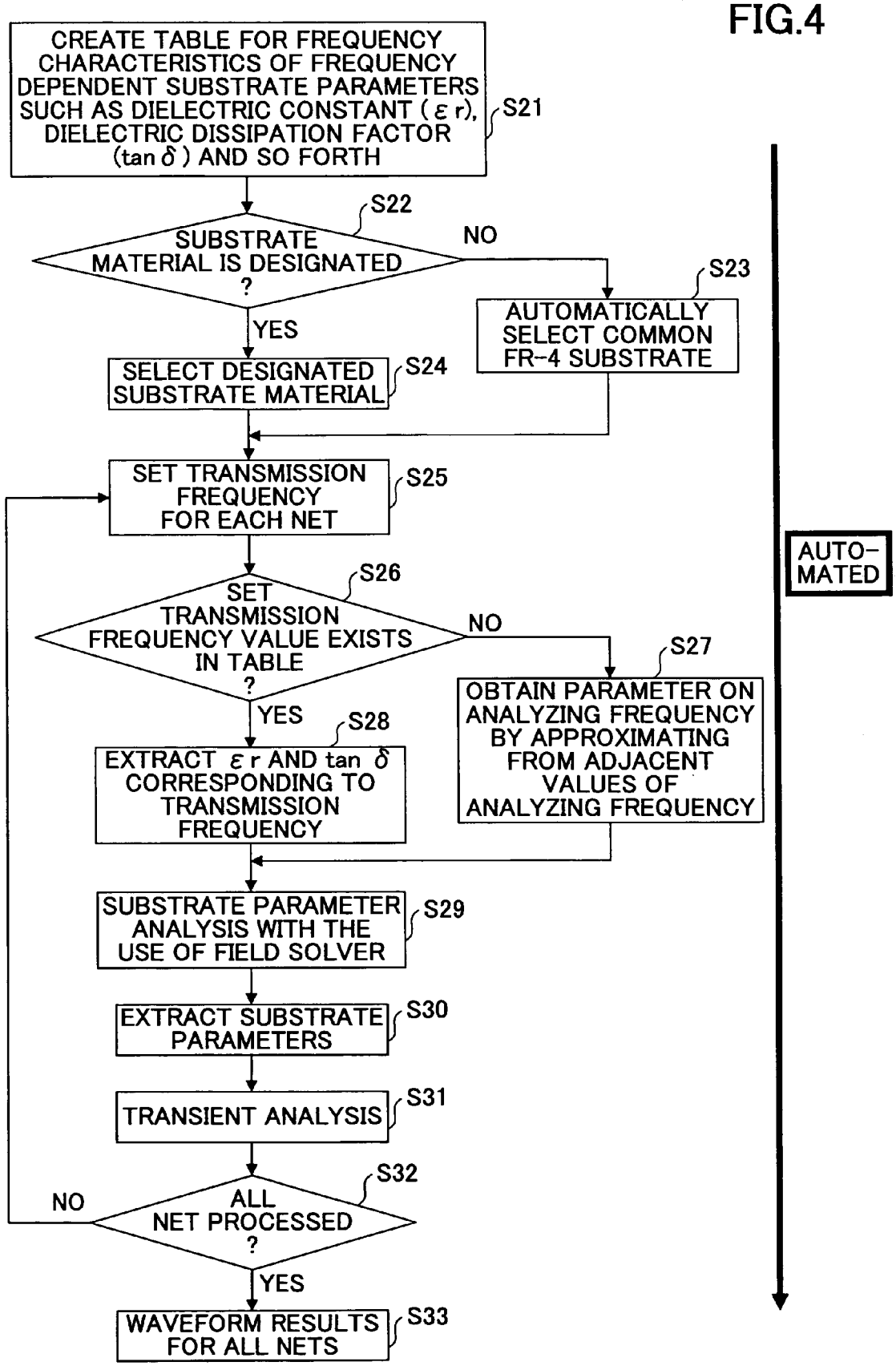

FIG. 4 shows a flow chart illustrating details of the work of Steps S3 through S4 or Steps S6 through S7 of FIG. 3.

In FIG. 4, operation of Steps S22 and S32 is automatically carried out as a result of a computer, configured as illustrated in FIG. 10, executing a predetermined program (i.e., the circuit analyzing program).

In FIG. 4, a table (corresponding to the table 13 of FIG. 2) is created previously as a result of values for each operating frequency/operating temperature of substrate parameters, i.e., dielectric constant ∈r, dielectric dissipation factor tan δ, and so forth, being obtained for a predetermined substrate material, through actual measurement or such (Step S21).

Next, when the simulation model is created, it is determined whether or not substrate material is designed by the user from the analyzing condition inputting part 11 (Step S22). When no specific designation for the substrate material is given, FR-4 (i.e., Frame Retardant Type 4) substrate is designated automatically as a common one (Step S23). On the other hand, when a specific designation for the substrate material is given, the thus-designated substrate material is set (Step S24).

Then, for the substrate material thus set in Step S23 or S24, a transmission frequency (i.e., operating frequency or analyzing frequency) is set for each net (i.e., each circuit network element included in the circuit unit) (Step S25).

Next, for the thus-set transmission frequency, it is determined whether or not the corresponding value is included in the table prepared in Step S21 (Step S26). If no corresponding value of the transmission frequency is included in the table 13, the substrate parameter value (i.e., the above-mentioned ∈r, tan δ, or such) on the corresponding transmission frequency value is obtained by means of linear approximation with the use of the substrate parameter values on the adjacent transmission frequency values included in the table (Step S27). On the other hand, when the corresponding transmission frequency value is included in the table, the substrate parameter value on the transmission frequency value is obtained (Step S28).

Then, based on the thus-obtained substrate parameter value, other necessary substrate parameter values are calculated by means of functions of the above-mentioned circuit analyzing simulation tool, i.e., the field solver (Steps S29 and S30).

Then, based on the thus-obtained all of the necessary substrate parameter values, operation of the circuit unit is analyzed in a simulation manner with the use of the circuit analyzing simulation tool (Step S29).

After that, the above-described processing of Steps S24 through S31 is carried out for all of the respective nets included in the circuit unit (Step S32). Thereby, simulation results of operation waveforms for all the nets are obtained (Step S33).

In the embodiment of the present invention, it is possible to carry out, with high precision, circuit operation analysis in a simulation manner with the use of the substrate parameters corresponding to the analyzing frequency.

It is noted that, in the process described above with reference to FIG. 4, the substrate parameter corresponding to the given analyzing frequency is obtained in Steps S21 through S28. However, in the same manner, the substrate parameter corresponding to the given analyzing temperature can be obtained. Further, in the same manner (i.e., the linear approximation may be applied if necessary), the substrate parameter, corresponding to the given analyzing frequency and also corresponding to the given analyzing temperature, can be obtained.

Figure 5:
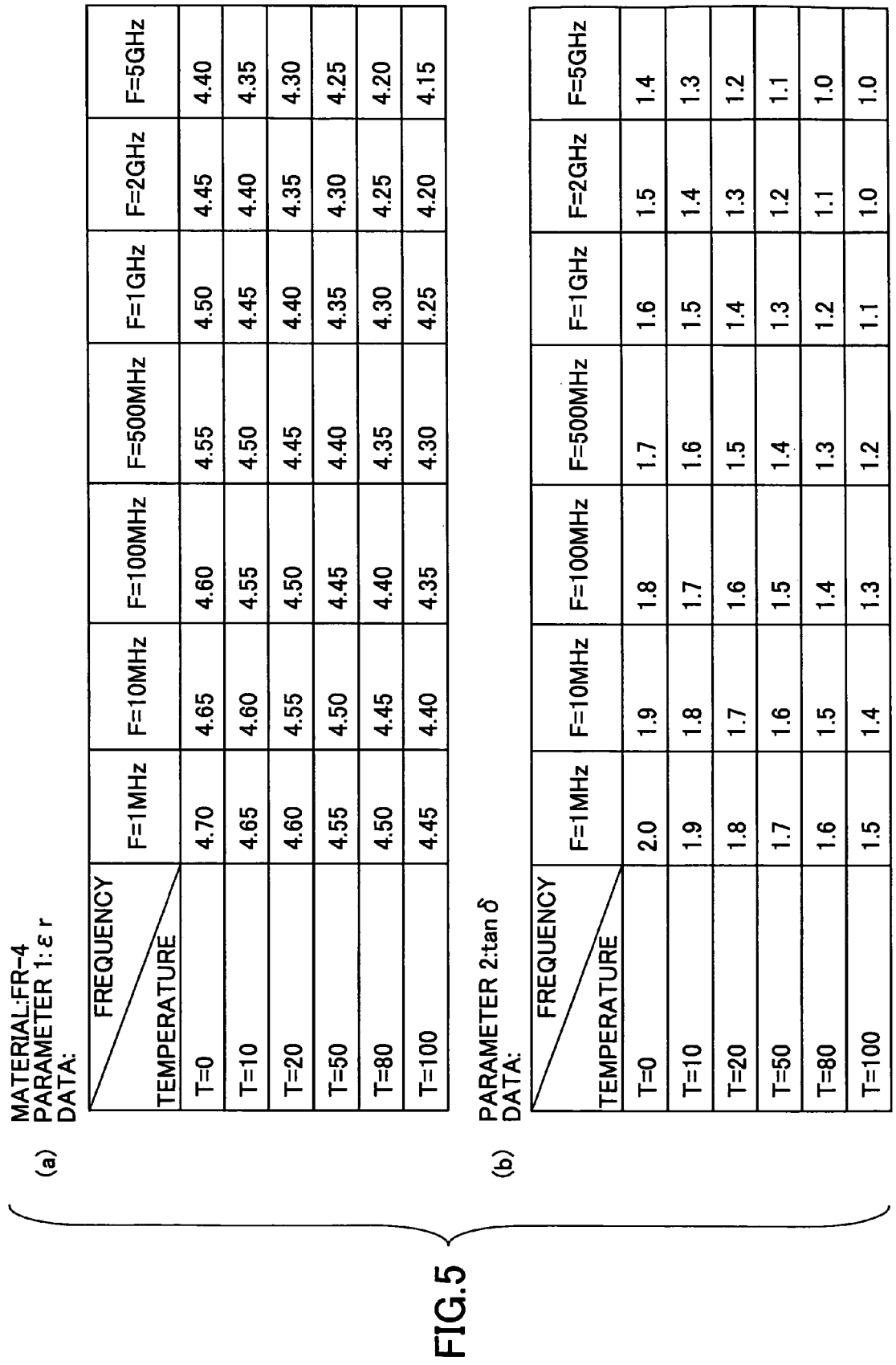

FIG. 5 shows one example of the table 13 created in Step S21 of FIG. 4.

In FIG. 5 (a) shows an example of the table of ∈r values on each operating frequency and each operating temperature, for FR-4 substrate, and FIG. 5 (b) shows an example of the table of tan δ values.

As the values of the tables, actually measured values or such, obtained from the corresponding substrate material, may be used.

Next, an actual example of calculation of the substrate parameters in Steps S29 and S30 of FIG. 4 will be described with reference to FIGS. 6 through 9.

Figure 6:
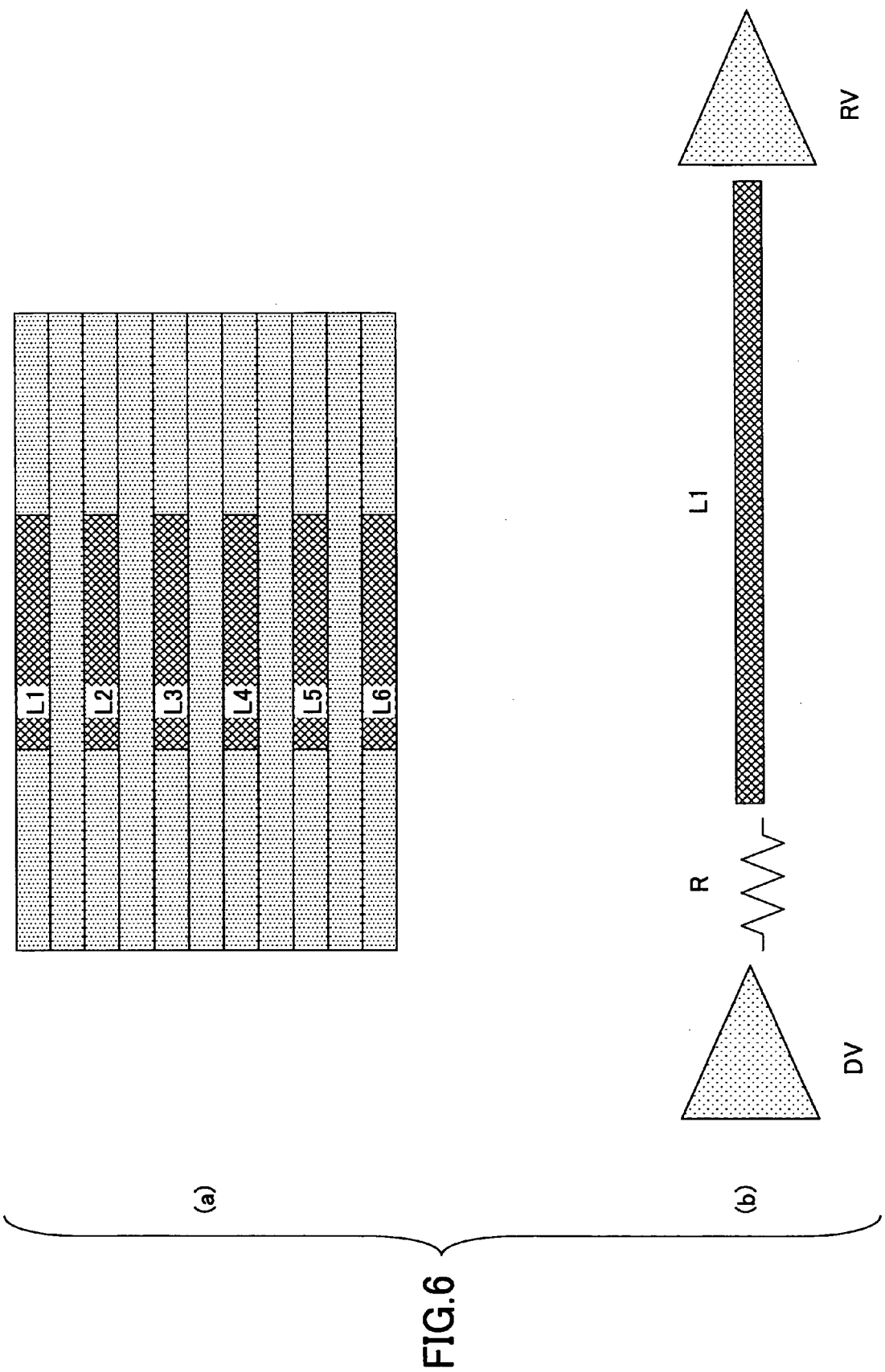

FIG. 6 (a) shows a layer structure of a substrate of a circuit unit to analyze, and FIG. 6 (b) shows a circuit configuration of the circuit unit.

In this example, description will be made for the following analyzing conditions, substrate material, substrate layer structure and circuit configuration, as an example.

Analyzing frequency: 1 GHz;
Analyzing temperature: 80° C.;
Substrate material: FR-4;
Layer structure: six layers as shown in FIG. 6 (a), i.e.,
S (signal layer) L1—G (ground layer) L2—S L3—S L4—V (power source layer) L5—S L6; and
Circuit configuration: DV (driver device)—damping resistor (R)—wiring (L1)—RV (receiver device), as shown in FIG. 6 (b).

Substrate parameters required for creating a simulation model (referred to as a 'w model', hereinafter) for a transmission simulation process required for the circuit operation analysis for this case are:

Inductance value L;
Capacitance value C;
Direct-current resistance value R0;
Conductance value G0;
Skin resistance factor value Rs; and
Dielectric loss factor value Gd.

Thereamong, the substrate parameters (R and L) which do not depend on the operating frequency are obtained from a sectional profile of the substrate. As a specific detailed calculation method for R and L, 'Program and method for calculating conductor resistance in consideration of skin effect', proposed by the Applicant of the present application, disclosed in Japanese Laid-open Patent Application No. 2003-132112, described later, may be applied.

Next, the substrate parameters C, Rs and Gd depending on the operating frequency are obtained.

Thereamong, the skin resistance factor Rs is obtained from the following calculation formula. It is noted that, also as a specific detailed calculation method for Rs, the above-mentioned 'Program and method for calculating conductor resistance in consideration of skin effect', proposed by the Applicant of the present application, disclosed in Japanese Laid-open Patent Application No. 2003-132112, described later, may be applied.

$$R = R0 + Rs\sqrt{f}$$

Therefrom, $$Rs = (R - R0)/\sqrt{f}$$

is obtained. Therefrom, Rs is obtained.

There, R0 denotes a direct-current resistance value and f denotes the given analyzing frequency (i.e., the operating frequency).

Next, the dielectric loss factor Gd is obtained from the following calculation formula:

$$Gd = 2\pi C \times \tan\delta$$

Not only Gd but also C depends on the operating frequency and temperature. This is because C depends on ∈r. It is noted that, this is because, a capacitance C of a parallel-plate capacitor in dielectric is obtained by the following formula where ∈0 denotes a relative dielectric constant, S denotes a plate area and d denotes a plate distance:

$$C = \in r \times \in 0 \times S/d$$

And, a configuration between the signal and the ground (GND) of the substrate can be regarded as the parallel-plate capacitor. Therefore, the values on the analyzing frequency and analyzing temperature of ∈r for obtaining C, as well as C and tan δ for obtaining Gd, are required.

When the designer or developer inputs the analyzing frequency 1 GHz, the substrate material FR-4 and the analyzing temperature 80° C., as the analyzing conditions, from the analyzing condition inputting part 11, the substrate parameter determining part 12 refers to the table 13, and, obtains the values of er and tan δ corresponding to these analyzing conditions. In the example of FIG. 5 (for the table 13), ∈r=4.3 and tan δ=1.2 are obtained (Step S28 of FIG. 4).

This setting operation is automatically carried out by the CPU of the computer as mentioned above. Further, at this time, when the values corresponding to the given analyzing conditions are not actually included in the table 13, the values are obtained by means of linear approximation with the adjacent values of the analyzing condition values (Step S27). In this case, it is possible to shorten the difference between the adjacent two values used for the linear approximation by originally creating the table 13 with fine graduations, and as a result, it is possible avoid a precision problem as much as possible even when obtaining the substrate parameters through the approximation process.

Based on the thus obtained substrate parameters, the simulation model for the transmission simulation process is created (Step S3 or S6 of FIG. 3), and, operation waveforms are obtained (Step S4 or S7) from transmission simulating calculation carried out with the use of the circuit simulator such as HSPICE (provided by Synopsis, Inc) or such (corresponding to the above-mentioned 'field solver').

FIG. 7 shows an example of the w model actually obtained based on the substrate parameters.

Thus, according to the embodiment of the present invention, previously the table is provided for the substrate parameters having frequency/temperature characteristics, and thus, it is possible to achieve a configuration in which, according to given analyzing frequency and temperature, appropriate values of frequency and temperature dependent substrate parameters are automatically selected and set.

Accordingly, it is possible to reduce a time required for the transmission simulation process, to improve precision of the operating waveforms obtained as the analysis results of the transmission simulation process, and thus, it is possible to remarkably reduce a total analysis time required for analyzing many transmission nets (circuit network elements) included in the circuit unit to analyze. As a result, it is possible to remarkably reduce a period required for developing the circuit unit.

It is noted that, in the embodiment of the present invention described above, the transmission simulation process for analyzing the circuit unit in the circuit analyzing method carried out by means of the circuit analyzing apparatus, is carried out based on an AW (i.e., artwork) design of the circuit unit. That is, the circuit analyzing method according to the embodiment of the present invention is a method for analyzing the 'design of AW of the circuit unit' carried out 'in a computer operated calculation basis', before actually manufacturing an actual product of the circuit unit.

Next, an example of the above-mentioned 'Program and method for calculating conductor resistance in consideration of skin effect', proposed by the Applicant of the present application, disclosed in Japanese Laid-open Patent Application No. 2003-132112, will be briefly described.

It is noted that, calculation of a skin resistance factor was carried out with reference to the following paper:

IBM J. RES. DEVELOP VOL. 23 No. 6 NOVEMBER 1979, 'Resistive and Inductive Skin Effect in Rectangular Conductors'

<Details of Calculation>

1) Substrate sectional dimension, conductance and frequency are input.

Figure 8:
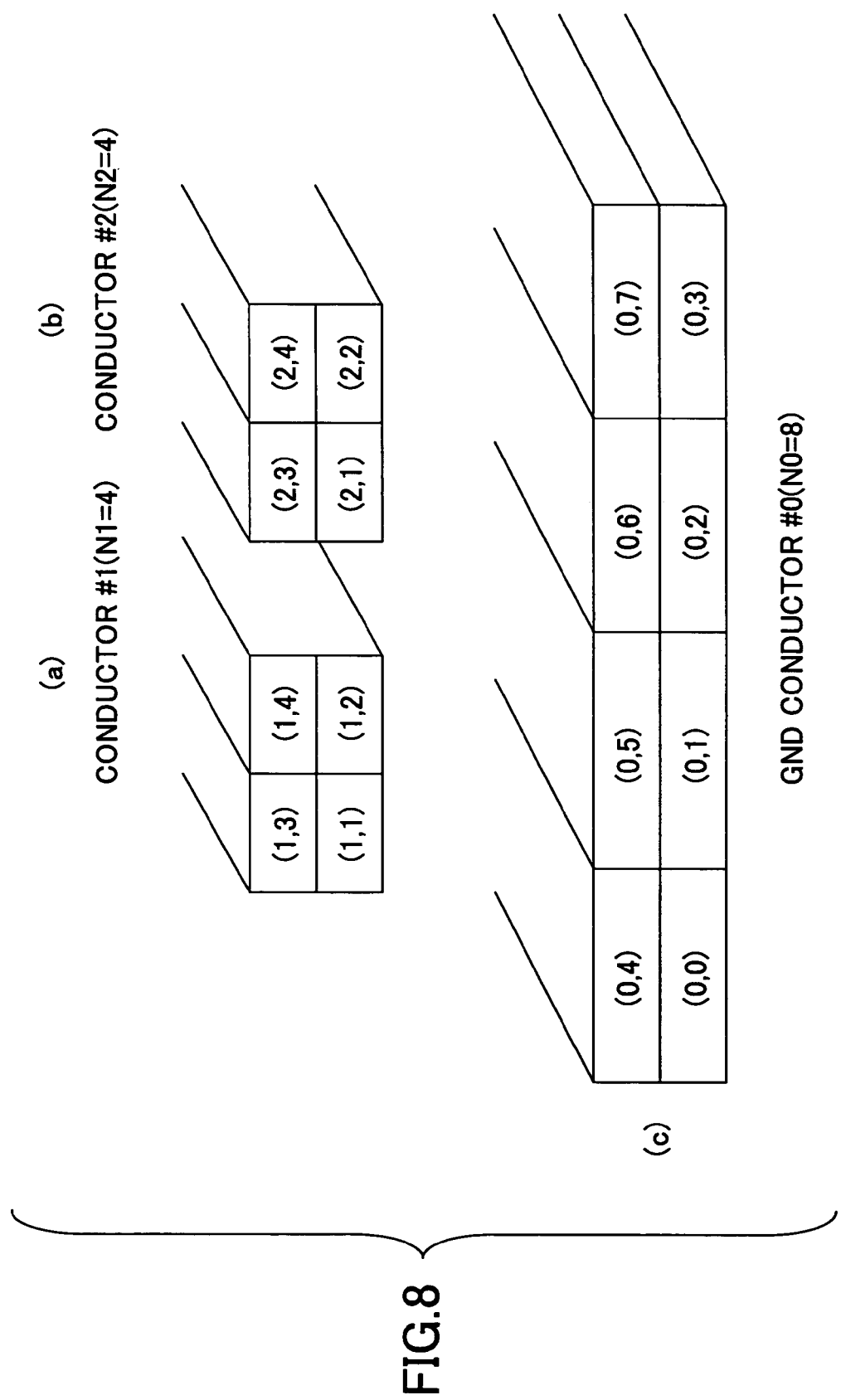
Figure 9:
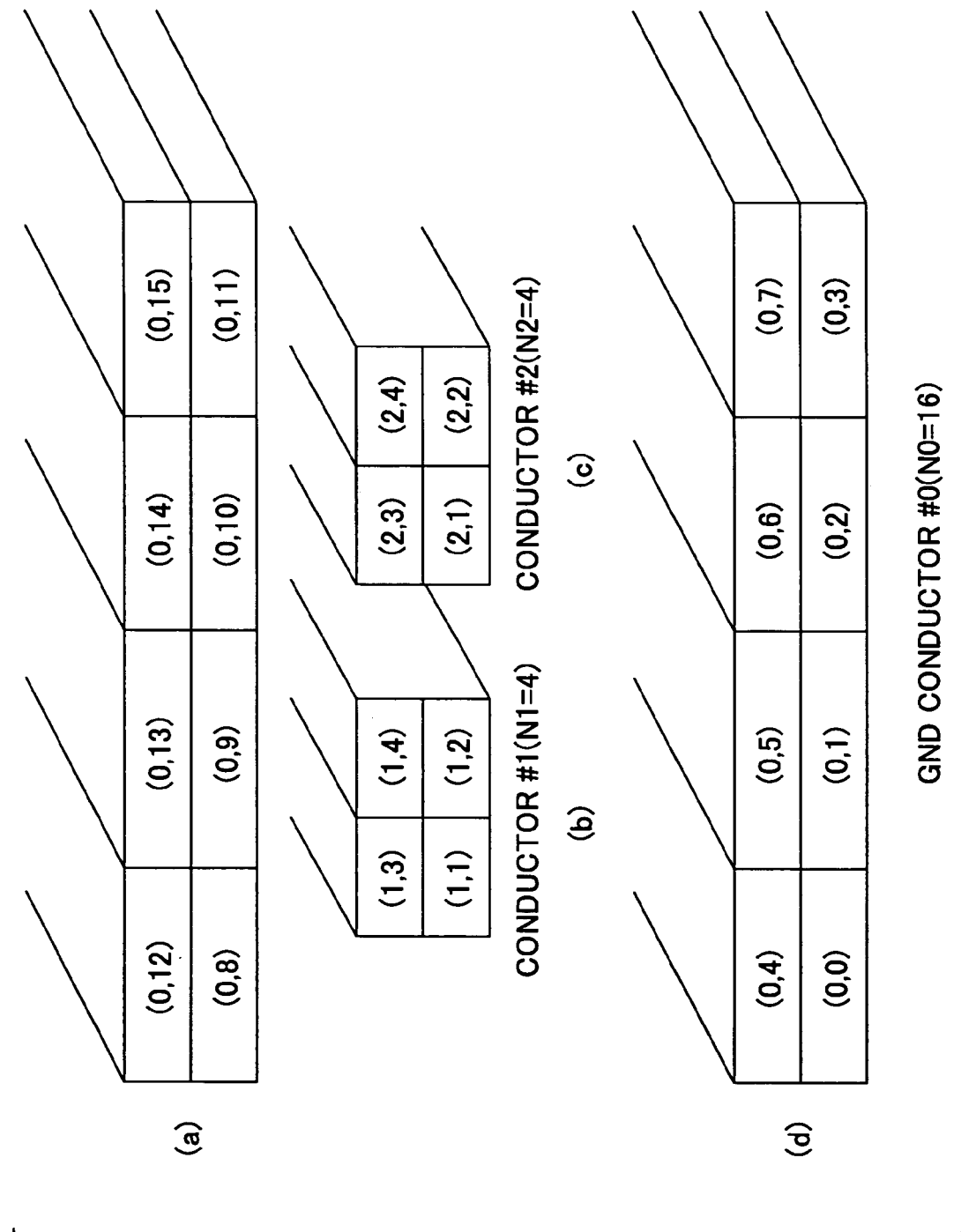

2) According to a predetermined rule, given conductors are divided into segments:

The respective conductors (FIGS. 8 (*a*) and (*b*) or FIGS. 9 (*b*) and (*c*)) except the GND (ground) conductor ((c)) are numbered in sequence from 1. The GND conductor is numbered as 0.

The conductors are divided finely into segments along the direction of electric currents flowing therethrough, and the thus-obtained segments are numbered in sequence from 1. For the GND conductor, numbering is made in sequence from 0. See a dividing image for a case of a micro strip line, shown in FIG. 8.

In the case of a strip line, both the top and bottom GND conductors (FIGS. 9 (*a*) and (*d*)) are numbered as 0, and the numbers given to the segments are consecutive numbers from the bottom to the top. See a dividing image for a case of a strip line, shown in FIG. 9.

It is noted that, FIG. 8 shows the dividing image for the case where the conductors to analyze correspond to a micro strip line while FIG. 9 shows the dividing image for the case where the conductors to analyze correspond to a strip line.

Inductance of the divided conductors is calculated by the following formulas.

It is noted that, i, k denote the numbers of the conductors (0 through N: N denotes the number of signal conductors), and j, m denote the numbers of the segments included in the conductors (1 through Ni: Ni denotes the number of segments of the target conductor).

$$L^{(P)}_{ij,km} = -\frac{\mu}{4\pi A_{ij} A_{km}} \int\int\int\int \ln[(y-y')^2 + (z-z')^2] dy' dz' dy dz \quad (1)$$

Further, μ denotes permeability (i.e., permeability $4\pi \times 10^{-7}$ of vacuum magnetic constant); and $A_{ij}$ denotes a sectional area of the segment.

Therefrom, calculation is carried out by the following formulas:

$$r_{ij} = \frac{1}{\sigma_i A_{ij}}, \delta_{ii} = 1, \delta_{ij} = 0, (i \neq j) \quad (2)$$

$$R_{ij,km} = r_{00} + r_{ij}\delta_{ik}\delta_{jm} \quad (3)$$

$$L_{ij,km} = L_{ij,km}^{(p)} - L_{ij,00}^{(p)} - L_{00,km}^{(p)} + L_{00,00}^{(p)} \quad (4)$$

3) An impedance matrix is calculated.
From the following formula:

$$Z_{ij,km} = R_{ij,km} + j\omega L_{ij,km} \quad (5)$$

the following two values are calculated, and, based thereon, calculation is carried out according to the following formulas starting from the item 4).
For DC (i.e., the frequency is 0 Hz): $Z_{ij,km(DC)}$
For a designated analyzing frequency f: $Z_{ij,km(f)}$
4) An admittance matrix is calculated.

$$Y_{(f)} = Z_{(f)}^{-1} \quad (6)$$

$$Y_{(DC)} = Z_{(DC)}^{-1} \quad (7)$$

5) Electric current values of the following respective segments are calculated. There, the value of V is 1 [V] as a default value.

$$I_{(f)} = Y_{(f)} V \quad (8)$$

6) The admittance matrix is reduced as follows:

$$y_{ik} = \sum_{j=1}^{Ni} \sum_{m=1}^{Nk} Y_{ij,km} \quad (9)$$

$$Y_{(f)} \Rightarrow y_{(f)} \quad (10)$$

$$Y_{(DC)} \Rightarrow y_{(DC)} \quad (11)$$

7) Finally, the impedance matrix is returned to, as follows:

$$z_{(f)} = y_{(f)}^{-1} \quad (12)$$

$$z_{(DC)} = y_{(DC)}^{-1} \quad (13)$$

8) The skin effect factor is obtained as follows:
From the formula of $Z(x) = R(x) + j\omega L(x)$, $$Rs = \frac{R_{(f)} - R_{(DC)}}{\sqrt{f}} \quad (14)$$

It is noted that, as to the direct-current resistance $R(x)$, it may be obtained as mentioned above theoretically. However, consequently, it is equivalent to a sum of the resistances of the signal conductors and the GND conductors. Accordingly, the following calculation method is actually applied:
For a single signal conductor:

$R$ = [direct – current resistance of signal conductor] + [direct – current resistance of GND conductor]

$= 1/(\sigma \times A sig1) + 1/(\sigma \times A gnd)$

For two signal conductors:

$R11$ = [direct – current resistance of signal conductor 1] + [direct – current resistance of GND conductor]

$= 1/(\sigma \times A sig1) + 1/(\sigma \times A gnd)$ $R12 = R21$ = [direct – current resistance of GND conductor]

$= 1/(\sigma \times A gnd)$ $R22$ = [direct – current resistance of signal conductor 2] + [direct – current resistance of GND conductor]

$= 1/(\sigma \times A sig2) + 1/(\sigma \times A gnd)$

There, Asig1 and Asig2 denote sectional areas of the signal conductors 1 and 2, respectively, and Agnd denotes a sectional area of the GND conductor (i.e., a sum of GND sectional areas for the case of a strip line).

Further, actually, the direct-current resistance is obtained, not with the sectional areas of the segments but with the sectional area of the conductor before the dividing.

FIG. 10 shows a block diagram of an example of a computer for illustrating a case where the above-described circuit analyzing apparatus is realized by the computer.

As shown in FIG. 10, the computer 100 has a CPU 101 for automatically executing various operations by executing instructions written in a given program; an operation part 102 made of a keyboard, a mouse, and so forth, for a user to input operating contents or data; a display part 103 made of a CRT or a liquid crystal display device, for displaying a processing progress or processing results of the CPU 101; a memory 104 made of a ROM, a RAM, and so forth, for storing the program, data and so forth, to be processed by the CPU 101; a hard disk drive 105 for storing the program, data and so forth; a CD-ROM drive 106 for externally loading the program or data, with the use of a CD-ROM as an information recording medium; and a modem 108 for downloading the program or data from an external server, via a communication network 109 such as the Internet, a LAN or such.

Thereamong, the operation part 102 corresponds to the analyzing condition inputting part 11 shown in FIG. 2; the CPU 101 and the memory 104 correspond to the substrate parameter determining part 12 and the operation analyzing part 14; the hard disk drive 105 stores the table 13; and the display part 103 corresponds to the analysis result outputting part 15.

The computer 100 loads or downloads the program (i.e., the circuit analyzing program in the embodiment of the present invention) having the instructions for causing the CPU 101 to execute the circuit analyzing operations for the transmission simulation process described above with reference to FIGS. 3 and 4, via the CD-ROM 107 or via the communication network 109, the program is then installed in the hard disk drive 105, is appropriately loaded in the memory 104, and is executed by the CPU 101. As a result, the computer 100 carries out the above-mentioned circuit analyzing operations automatically.

The present invention is not limited to the above-described embodiments, and variations and modifications may be made without departing from the basic concept of the present invention claimed below.

The present application is based on Japanese Priority Application No. 2006-168165, filed on Jun. 16, 2006, the entire contents of which are hereby incorporated herein by reference.

What is claimed is:

1. A circuit analyzing apparatus for analyzing operation characteristics of a circuit unit in which, on a substrate, circuit devices are arranged, comprising:
   a first part for automatically obtaining a first value of a substrate parameter concerning the substrate for an operating frequency, which first value depends on the operating frequency, said substrate parameter comprising at least one of dielectric constant ∈r and dielectric dissipation factor tan δ; and
   a part for analyzing operation of the circuit unit based on at least the value of the substrate parameter for the operating frequency,
   wherein:
      in the circuit operation analysis, a simulation model is created based on the substrate parameter, and simulation is carried out for circuit operation using said simulation model to thereby obtain operation waveforms.

2. The circuit analyzing apparatus as claimed in claim 1, wherein:
   a table is provided for the first value for the operating frequency of the substrate parameter depending on the operating frequency, said first part for automatically obtaining the first value of the substrate parameter depending on the operating frequency obtains the first value of the substrate parameter for the operating frequency based on said table.

3. The circuit analyzing apparatus as claimed in claim 1, further comprising:
   a second part for automatically obtaining a second value of the substrate parameter concerning the substrate for an operating temperature, which second value depends on the operating temperature, wherein:
      said part for analyzing operation of the circuit unit analyzes operation of the circuit unit based on the first value of the substrate parameter for the operating frequency and the substrate parameter for the operating temperature obtained by means of said first part for automatically obtaining the first value of the substrate parameter concerning the substrate for the operating frequency and said second part for automatically obtaining the second value of the substrate parameter concerning the substrate for the operating temperature.

4. A circuit analyzing apparatus for analyzing operation characteristics of a circuit unit in which, on a substrate, circuit devices are arranged, comprising:
   a part for automatically obtaining a value of a substrate parameter concerning the substrate for an operating temperature, which value depends on the operating temperature, said substrate parameter comprising at least one of dielectric constant ∈r and dielectric dissipation factor tan δ; and
   a part for analyzing operation of the circuit unit based on the value of the substrate parameter for the operating temperature,
   wherein:
      in the circuit operation analysis, a simulation model is created based on the substrate parameter and simulation is carried out for circuit operation using said simulation model to thereby obtain operation waveforms.

5. The circuit analyzing apparatus as claimed in claim 4, wherein:
   a table is provided for the value for the operating temperature of the substrate parameter depending on the operating temperature, said part for automatically obtaining the value of the substrate parameter depending on the operating temperature obtains the value of the substrate parameter for the operating temperature based on said table.

6. A circuit analyzing method for analyzing operation characteristics of a circuit unit in which, on a substrate, circuit devices are arranged, comprising the steps of:
   automatically obtaining, by means of arithmetic processing of a CPU, a first value of a substrate parameter concerning the substrate for an operating frequency, which first value depends on the operating frequency, said substrate parameter comprising at least one of dielectric constant ∈r and dielectric dissipation factor tan δ; and
   analyzing, by means of arithmetic processing of the CPU, operation of the circuit unit based on the first value of the substrate parameter for the operating frequency,
   wherein:
      in the circuit operation analysis, a simulation model is created based on the substrate parameter, and simulation is carried out for circuit operation using said simulation model to thereby obtain operation waveforms.

7. The circuit analyzing method as claimed in claim 6, wherein:
   a table is provided for the first value for the operating frequency of the substrate parameter depending on the operating frequency, said step of obtaining the first value of the substrate parameter depending on the operating frequency obtains the first value of the substrate parameter for the operating frequency based on said table.

8. The circuit analyzing method as claimed in claim 6, further comprising the step of:
   automatically obtaining, by means of arithmetic processing of the CPU, a second value of the substrate parameter concerning the substrate for an operating temperature, said second value depends on the operating temperature, wherein:
      said step for analyzing operation of the circuit unit analyzes operation of the circuit unit based on the first value of the substrate parameter for the operating frequency and the second value of the substrate parameter for the operating temperature obtained from said step of automatically obtaining the first value of the substrate parameter concerning the substrate for the operating frequency and said step of automatically obtaining the second value of the substrate parameter concerning the substrate for the operating temperature.

9. A circuit analyzing method for analyzing operation characteristics of a circuit unit in which, on a substrate, circuit devices are arranged, comprising the steps of:
   obtaining, by means of arithmetic processing of the CPU, a value of a substrate parameter concerning the substrate for an operating temperature, which value depends on the operating temperature, said substrate parameter comprising at least one of dielectric constant ∈r and dielectric dissipation factor tan δ; and analyzing, by means of arithmetic processing of the CPU, operation of the circuit unit based on the value of the substrate parameter for the operating temperature, wherein:

in the circuit operation analysis, a simulation model is created based on the substrate parameter, and simulation is carried out for circuit operation using said simulation model to thereby obtain operation waveforms.

10. The circuit analyzing method as claimed in claim 9, wherein:

a table is provided for the value for the operating temperature of the substrate parameter depending on the operating temperature, said step of obtaining the value of the substrate parameter depending on the operating temperature obtains the value of the substrate parameter for the operating temperature based on said table.

11. A circuit analyzing program for causing a computer to carry out a circuit analyzing method for analyzing operation characteristics of a circuit unit in which, on a substrate, circuit devices are arranged, comprising instructions for causing the computer to execute the steps of:

automatically obtaining by means of arithmetic processing of a CPU, a first value of a substrate parameter concerning the substrate for an operating frequency, said first value depends on the operating frequency, said substrate parameter comprising at least one of dielectric constant ∈r and dielectric dissipation factor tan δ; and analyzing, by means of arithmetic processing of the CPU, operation of the circuit unit based on the first value of the substrate parameter for the operating frequency, wherein:

in the circuit operation analysis, a simulation model is created based on the substrate parameter, and simulation is carried out for circuit operation using said simulation model to thereby obtain operation waveforms.

12. The circuit analyzing program as claimed in claim 11, wherein:

a table is provided for the first value for the operating frequency of the substrate parameter depending on the operating frequency, said step of obtaining the first value of the substrate parameter depending on the operating frequency obtains the first value of the substrate parameter for the operating frequency based on said table.

13. The circuit analyzing program as claimed in claim 11, further comprising instructions for causing the computer to execute the step of:

automatically obtaining, by means of arithmetic processing of a CPU, a second value of the substrate parameter concerning the substrate for an operating temperature, said second value depends on the operating temperature, wherein:

said step of analyzing operation of the circuit unit analyzes operation of the circuit unit based on the first value of the substrate parameter for the operating frequency and the second value of the substrate parameter for the operating temperature obtained from said step of automatically obtaining the first value of the substrate parameter concerning the substrate for the operating frequency and said step of automatically obtaining the second value of the substrate parameter concerning the substrate for the operating temperature.

14. A circuit analyzing program for causing a computer to carry out a circuit analyzing method for analyzing operation characteristics of a circuit unit in which, on a substrate, circuit devices are arranged, comprising instructions for causing the computer to execute the steps of:

automatically obtaining, by means of arithmetic processing of a CPU, a value of a substrate parameter concerning the substrate for an operating temperature, said value depends on the operating temperature, said substrate parameter comprising at least one of dielectric constant ∈r and dielectric dissipation factor tan δ; and analyzing, by means of arithmetic processing of the CPU, operation of the circuit unit based on the value of the substrate parameter for the operating temperature, wherein:

in the circuit operation analysis, a simulation model is created based on the substrate parameter, and simulation is carried out for circuit operation using said simulation model to thereby obtain operation waveforms.

15. The circuit analyzing program as claimed in claim 14, wherein:

a table is provided for the value for the operating temperature of the substrate parameter depending on the operating temperature, said step of obtaining the value of the substrate parameter depending on the operating temperature obtains the value of the substrate parameter for the operating temperature based on said table.

* * * * *